US008324682B2

(12) United States Patent
Chen et al.

(10) Patent No.: US 8,324,682 B2
(45) Date of Patent: Dec. 4, 2012

(54) DYNAMIC RANDOM ACCESS MEMORY CELL AND ARRAY HAVING VERTICAL CHANNEL TRANSISTOR

(75) Inventors: Hui-Huang Chen, Changhua County (TW); Chih-Yuan Chen, Yilan County (TW); Sheng-Fu Yang, Tainan (TW); Chun-Cheng Chen, Changhua County (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 13/030,116

(22) Filed: Feb. 17, 2011

(65) Prior Publication Data

US 2012/0153371 A1    Jun. 21, 2012

(30) Foreign Application Priority Data

Dec. 15, 2010 (TW) ................................ 99144063 A

(51) Int. Cl.
*H01L 29/772* (2006.01)
(52) U.S. Cl. ................ 257/327; 257/328; 257/E21.375; 257/E29.262
(58) Field of Classification Search .................. 257/327, 257/329, 365, 379, E21.375, E29.255, E29.262; 438/268, 270
See application file for complete search history.

(56) References Cited

U.S. PATENT DOCUMENTS

| 5,278,090 | A  | * | 1/1994  | Yoshida ........................ 438/242 |
|-----------|----|---|---------|------------------------------------------|
| 5,341,326 | A  | * | 8/1994  | Takase et al. ................. 365/149   |
| 5,525,820 | A  | * | 6/1996  | Furuyama ..................... 257/296    |
| 5,574,299 | A  | * | 11/1996 | Kim ............................. 257/296 |
| 5,828,094 | A  | * | 10/1998 | Lee ............................... 257/296 |
| 5,973,356 | A  | * | 10/1999 | Noble et al. .................... 257/319 |
| 6,077,745 | A  | * | 6/2000  | Burns et al. .................... 438/270 |
| 6,208,164 | B1 | * | 3/2001  | Noble et al. ..................... 326/41 |
| 6,242,775 | B1 | * | 6/2001  | Noble ............................ 257/330 |
| 6,352,894 | B1 | * | 3/2002  | Goebel et al. ................. 438/253   |
| 6,804,142 | B2 | * | 10/2004 | Forbes ........................... 365/149 |
| 6,939,763 | B2 | * | 9/2005  | Schlosser et al. ............. 438/253    |
| 7,120,046 | B1 | * | 10/2006 | Forbes ........................... 365/149 |
| 7,195,959 | B1 | * | 3/2007  | Plummer et al. ............... 438/133    |
| 7,491,995 | B2 | * | 2/2009  | Forbes .......................... 257/296 |
| 7,564,088 | B1 | * | 7/2009  | Forbes .......................... 257/302 |
| 8,174,065 | B2 | * | 5/2012  | Kim et al. ..................... 257/330  |
| 2001/0010957 | A1 | * | 8/2001  | Forbes et al. ................. 438/248 |
| 2002/0149048 | A1 | * | 10/2002 | Noble et al. .................... 257/302 |
| 2003/0129001 | A1 | * | 7/2003  | Kisu et al. ...................... 399/200 |
| 2003/0142564 | A1 | * | 7/2003  | Forbes et al. ................. 365/200   |
| 2004/0007721 | A1 | * | 1/2004  | Forbes et al. ................. 257/204   |
| 2004/0090816 | A1 | * | 5/2004  | Forbes ........................... 365/149 |
| 2004/0132232 | A1 | * | 7/2004  | Noble ............................ 438/142 |
| 2006/0172483 | A1 | * | 8/2006  | Forbes .......................... 438/212 |
| 2007/0075359 | A1 | * | 4/2007  | Yoon et al. ..................... 257/329 |
| 2007/0138524 | A1 | * | 6/2007  | Kim et al. ..................... 257/296  |

(Continued)

*Primary Examiner* — Jarrett Stark
*Assistant Examiner* — Michele Fan
(74) *Attorney, Agent, or Firm* — Jianq Chyun IP Office

(57) ABSTRACT

A dynamic random access memory cell having vertical channel transistor includes a semiconductor pillar, a drain layer, an assisted gate, a control gate, a source layer, and a capacitor. The vertical channel transistor has an active region formed by the semiconductor pillar. The drain layer is formed at the bottom of the semiconductor pillar. The assisted gate is formed beside the drain layer, and separated from the drain layer by a first gate dielectric layer. The control gate is formed beside the semiconductor pillar, and separated from the active region by a second gate dielectric layer. The source layer is formed at the top of the semiconductor pillar. The capacitor is formed to electrical connect to the source layer.

9 Claims, 3 Drawing Sheets

U.S. PATENT DOCUMENTS

| | | | |
|---|---|---|---|
| 2008/0173936 A1* | 7/2008 | Yoon et al. | 257/329 |
| 2009/0108340 A1* | 4/2009 | Seo | 257/329 |
| 2009/0207649 A1* | 8/2009 | Tang et al. | 365/149 |
| 2009/0238010 A1* | 9/2009 | Juengling | 365/189.07 |
| 2010/0032739 A1* | 2/2010 | Lindholm et al. | 257/296 |
| 2010/0032743 A1* | 2/2010 | Huang et al. | 257/306 |
| 2010/0142294 A1* | 6/2010 | Carman | 365/191 |
| 2010/0173460 A1* | 7/2010 | Forbes | 438/268 |
| 2010/0181613 A1* | 7/2010 | Kim et al. | 257/329 |
| 2010/0213524 A1* | 8/2010 | Jeon et al. | 257/306 |
| 2010/0216289 A1* | 8/2010 | Park et al. | 438/268 |
| 2011/0121383 A1* | 5/2011 | Forbes | 257/329 |
| 2011/0121396 A1* | 5/2011 | Lee | 257/365 |
| 2011/0284939 A1* | 11/2011 | Chung et al. | 257/296 |
| 2012/0094455 A1* | 4/2012 | Cho et al. | 438/270 |

* cited by examiner

US 8,324,682 B2

DYNAMIC RANDOM ACCESS MEMORY CELL AND ARRAY HAVING VERTICAL CHANNEL TRANSISTOR

CROSS-REFERENCE TO RELATED APPLICATION

This application claims the priority benefit of Taiwan application serial no. 99144063, filed on Dec. 15, 2010. The entirety of the above-mentioned patent application is hereby incorporated by reference herein and made a part of this specification.

BACKGROUND OF THE INVENTION

1. Field of the Invention

The invention relates to a semiconductor device and a fabricating method thereof and more particularly to a dynamic random access memory cell and a dynamic random access memory cell array having vertical channel transistor.

2. Description of Related Art

With the function of computer micro-processors becomes more powerful, the number of programs and operations performed by software becomes greater. Thus, the fabrication technology of memory has become one of the most important technologies in the semiconductor industry. Dynamic random access memory (DRAM) is a volatile memory constituted by a plurality of memory cells. Each of the memory cells is mainly formed by a transistor and a capacitor. Moreover, each of the memory cells is electrically connected to one another through word lines (WLs) and bit lines (BLs).

Along with the development of technology and under demands for size reduction of devices, the length of the channel region in the transistor of DRAM is gradually shortened for the devices to operate faster. However, this leads to problems such as severe short channel effect and on current reduction of transistors.

Therefore, a conventional method for solving the above problems includes changing the transistor in the horizontal direction into the transistor in the vertical direction. In the structure of DRAM, the vertical transistor is fabricated in the trench and the embedded BLs and the embedded WLs are formed.

In one method of disposing the embedded BLs, the doped region is directly formed in the semiconductor substrate. However, the embedded BLs formed by the doped region have higher resistance and cannot enhance the performance of devices. The fabrication becomes more difficult when the doping concentration and doping depth are increased to lower the resistance of the embedded BLs.

In another method of disposing the embedded BLs, the metal embedded BLs are formed. However, the fabrication of the metal embedded BLs is complicated. Moreover, when operating DRAM, severe coupling noise may be generated between two adjacent embedded BLs so as to affect the performance of devices.

SUMMARY OF THE INVENTION

Accordingly, the invention is directed to a dynamic random access memory cell and a dynamic random access memory cell array having vertical channel transistor which are capable of preventing the generating of coupling noise between adjacent BLs and enhancing device performance.

The invention is directed to a dynamic random access memory cell having vertical channel transistor. The dynamic random access memory cell includes a semiconductor pillar, a drain layer, an assisted gate, a control gate, a source layer, and a capacitor. The semiconductor pillar is disposed in a semiconductor substrate and forms an active region of a vertical channel transistor. The drain layer is disposed at the bottom of the semiconductor pillar. The assisted gate is disposed beside the drain layer and separated from the drain layer by a first gate dielectric layer. The control gate is disposed beside the semiconductor pillar and separated from the active region by a second gate dielectric layer. The source layer is disposed at the top of the semiconductor pillar. The capacitor is electrically connected to the source layer.

In one embodiment of the invention, the assisted gate is disposed on two opposite sidewalls of the drain layer.

In one embodiment of the invention, the control gate is disposed on two opposite sidewalls of the semiconductor pillar.

In one embodiment of the invention, the drain layer includes a doped layer.

The invention is directed to a dynamic random access memory array having vertical channel transistor. The dynamic random access memory array includes a plurality of memory cells, a plurality of embedded bit lines (BLs), a plurality of assisted gate lines, and a plurality of embedded word lines (WLs). The memory cells are disposed in the semiconductor substrate and arranged into an array of columns and rows. Each of the memory cells includes a semiconductor pillar, a drain layer, an assisted gate, a control gate, a source layer, and a capacitor. The semiconductor pillar is disposed in a semiconductor substrate and forms an active region of a vertical channel transistor. The drain layer is disposed at a bottom of the semiconductor pillar. The assisted gate is disposed beside the drain layer and separated from the drain layer by a first gate dielectric layer. The control gate is disposed beside the semiconductor pillar and separated from the active region by a second gate dielectric layer. The source layer is disposed at a top of the semiconductor pillar. The capacitor is electrically connected to the source layer.

The embedded BLs are disposed in parallel under the semiconductor pillars, extend along a column direction, and are electrically connected to the drain layers of the same column. The assisted gate lines are disposed beside the embedded BLs and electrically connected to the assisted gates of the same column. The embedded WLs are disposed in parallel above the embedded BLs, extend along a row direction, and are electrically connected to the control gates of the same row.

In one embodiment of the invention, each of the embedded BLs is disposed between two adjacent assisted gate lines.

In one embodiment of the invention, each of the embedded WLs is disposed on two opposite sidewalls of each of the semiconductor pillars respectively.

In one embodiment of the invention, each of the embedded BLs includes a doped region.

In one embodiment of the invention, the assisted gate lines are electrically connected to one another.

As the dynamic random access memory cell and dynamic random access memory cell array having vertical channel transistor of the invention have the assisted gates (assisted gate lines) disposed therein, the resistance of the embedded BLs can be controlled by applying a voltage via the assisted gates (assisted gate lines). The resistance of the embedded BLs is then lowered to enhance the operation efficiency of the device. Moreover, the height of the embedded BLs can be controlled through the height of the assisted gates (assisted gate lines).

In the dynamic random access memory cell and dynamic random access memory cell array having vertical channel transistor of the invention, as the assisted gates (assisted gate lines) are disposed between the embedded BLs, the generation of coupling noise between adjacent BLs can be prevented, thereby reducing the device size.

Additionally, the methods for fabricating the dynamic random access memory cell and dynamic random access memory cell array having vertical channel transistor of the invention are simple.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1:
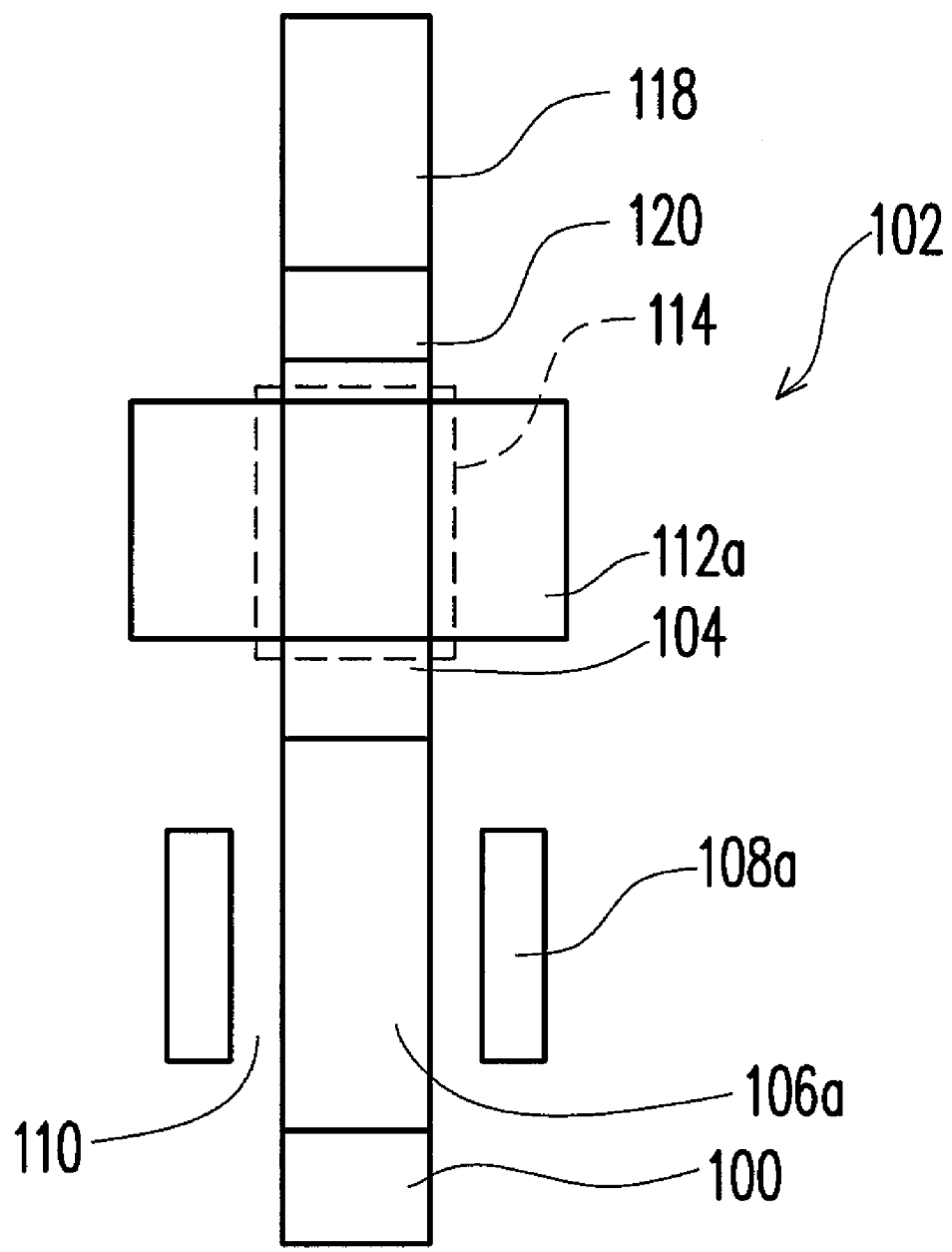
FIG. 1 illustrates a cross-sectional view of a dynamic random access memory cell having vertical channel transistor array according to an embodiment of the invention.

FIG. 1 illustrates a cross-sectional view of a dynamic random access memory cell having vertical channel transistor array according to an embodiment of the invention.

Referring to FIG. 1, a dynamic random access memory cell 102 having vertical channel transistor of the invention includes a semiconductor pillar 104, a drain layer 106a, an assisted gate 108a, a control gate 112a, a capacitor 118, and a source layer 120.

The semiconductor pillar 104 is disposed in a semiconductor substrate 100 and forms an active region of a vertical channel transistor. The semiconductor substrate 100 is, for example, a silicon substrate. The semiconductor pillar 104 is, for example, a silicon pillar.

The drain layer 106a is disposed at the bottom of the semiconductor pillar 104. The drain layer 106a is constituted by a doped region, for example. The drain layer 106a can be an N-type doped region or a P-type doped region corresponding to the type of the vertical channel transistor. The P-type doped region is doped with an element from group IIIA of periodic table of the elements, such as boron (B), gallium (Ga), indium (In), and the like, for instance. The N-type doped region is doped with an element from group VA of periodic table of the elements, such as phosphorus (P), arsenic (As), stibium (Sb), and the like, for instance.

The assisted gate 108a is disposed beside the drain layer 106a and separated from the drain layer 106a by a gate dielectric layer 110. The assisted gate 108a is disposed on two opposite sidewalls of the drain layer 106a. The assisted gate 108a is fabricated with N-type doped silicon, P-type doped silicon, or metal material such as tungsten (W), copper (Cu), aluminum (Al), copper aluminum alloy, silicon copper aluminum alloy, and so on. The gate dielectric layer 110 is fabricated with silicon oxide, silicon nitride, and so on.

The control gate 112a is disposed beside the semiconductor pillar 104 and separated from the active region by a gate dielectric layer 114. The control gate 112a is disposed on two opposite sidewalls of the semiconductor pillar 104. The control gate 112a is fabricated with N-type doped silicon, P-type doped silicon, or metal material such as W, Cu, Al, copper aluminum alloy, silicon copper aluminum alloy, and so on. The gate dielectric layer 114 is fabricated with silicon oxide, silicon nitride, and so on.

The source layer 120 is disposed at the top of the semiconductor pillar 104. The source layer 120 is constituted by a doped region, for example. The source layer 120 can be an N-type doped region or a P-type doped region corresponding to the type of the vertical channel transistor. The P-type doped region is doped with an element from group IIIA of periodic table of the elements, such as B, Ga, In, and the like, for instance. The N-type doped region is doped with an element from group VA of periodic table of the elements, such as P, As, Sb, and the like, for instance.

The capacitor 118 is electrically connected to the source layer 120.

The dynamic random access memory cell array having vertical channel transistor of the invention is illustrated in the following.

Figure 2A:
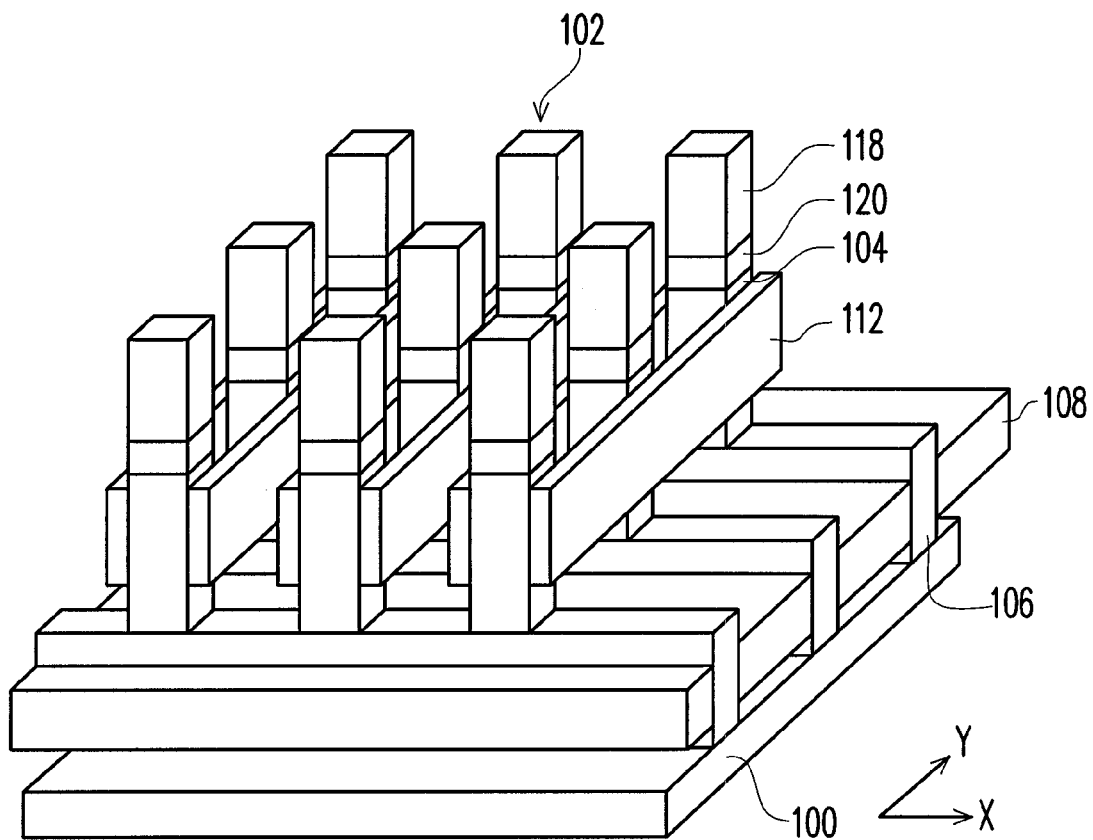
FIG. 2A illustrates a partial perspective view of a dynamic random access memory cell array having vertical channel transistor according to an embodiment of the invention.

FIG. 2A illustrates a partial perspective view of a dynamic random access memory cell array having vertical channel transistor according to an embodiment of the invention. For the simplification of the drawings, only the main elements such as the semiconductor pillar, the embedded BLs, the assisted gate lines, the embedded WLs, and the capacitors are shown.

Figure 2B:
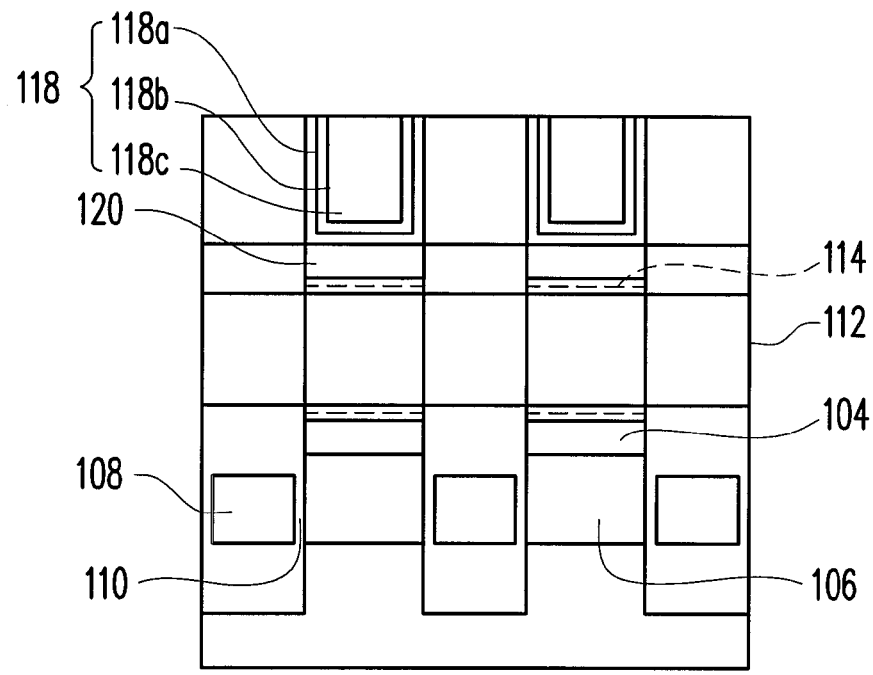
FIG. 2B depicts a cross-sectional view taken along a direction of a plurality of embedded word lines in FIG. 2A.
Figure 2C:
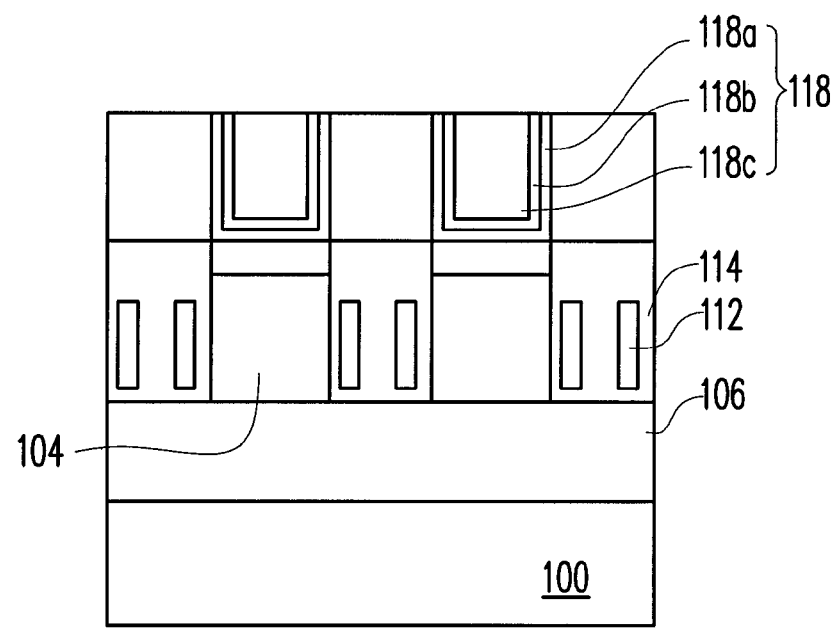
FIG. 2C depicts a cross-sectional view taken along a direction of a plurality of embedded bit lines in FIG. 2A.

FIG. 2B depicts a cross-sectional view taken along a direction of the embedded WLs in FIG. 2A. FIG. 2C depicts a cross-sectional view taken along a direction of the embedded BLs in FIG. 2A.

In FIGS. 2A to 2C, members identical to those shown in FIG. 1 are denoted with the same numbers and the descriptions thereof are omitted hereinafter.

Referring to FIGS. 2A through 2C, the dynamic random access memory cell array having vertical channel transistor of the invention is disposed in a semiconductor substrate 100. The semiconductor substrate 100 is, for example, a silicon substrate.

The dynamic random access memory cell array includes a plurality of memory cells 102, a plurality of embedded BLs 106, a plurality of assisted gate lines 108, and a plurality of embedded WLs 112.

The memory cells 102 are disposed in the semiconductor substrate 100 and arranged into an array of columns and rows. A semiconductor pillar 104 of each of the memory cells 102 forms an active region of a vertical channel transistor.

The embedded BLs are disposed in parallel in the semiconductor substrate, located under the semiconductor pillar 104, and extend along a column direction (Y direction). The embedded BLs 106 are constituted by a doped region and electrically connected to a plurality of drain layers 106a of the memory cells 102 in the same column. The embedded BLs 106 can be an N-type doped region or a P-type doped region.

The assisted gate lines 108 are disposed beside the embedded BLs 106 and separated from the drain layers 106a by a gate dielectric layer 110. Each of the embedded BLs 106 are disposed between two adjacent assisted gate lines 108. The assisted gate lines 108 extend in the column direction (Y direction) and are electrically connected to a plurality of assisted gates 108a of the memory cells 102 in the same column. The assisted gate lines 108 are fabricated with N-type doped silicon, P-type doped silicon, or metal material such as W, Cu, Al, copper aluminum alloy, silicon copper aluminum alloy, and so on. In the present embodiment, the assisted gate lines 108 are electrically connected to one another. In another embodiment the assisted gate lines 108 are disposed on two opposite sidewalls of each of the embedded BLs 106 respectively.

The embedded WLs 112 are disposed above the embedded BLs 106 in parallel, extend along a row direction (X direction), and electrically connected to a plurality of control gates 112a of the memory cells 102 in the same row. Each of the embedded WLs 112 are disposed on two opposite sidewalls of the semiconductor pillars 104 in the same row respectively. The embedded WLs 112 is fabricated with N-type doped silicon, P-type doped silicon, or metal material such as W, Cu, Al, copper aluminum alloy, silicon copper aluminum alloy, and so on. In another embodiment, each of the embedded WLs 112 has a barrier layer (not shown) fabricated with, for example, titanium nitride (TiN), titanium (Ti)/titanium nitride (TiN), Cobalt (Co)/titanium nitride (TiN), and so on.

A plurality of capacitors 118 are electrically connected to each of the semiconductor pillars 104 through a source layer 120 respectively. Each of the capacitors 118 includes a bottom electrode 118a, a capacitor dielectric layer 118b, and an upper electrode 118c. The bottom electrodes 118a and the upper electrodes 118c are fabricated with metal material such as W, Cu, Al, copper aluminum alloy, silicon copper aluminum alloy, and the like. The capacitor dielectric layers 118b, for instance, are dielectric material layers fabricated using dielectric material with high dielectric constants to increase the capacitance of the capacitor. The dielectric material layers with high dielectric constants are fabricated using, for example, silicon oxide/silicon nitride/silicon oxide (ONO), silicon nitride/silicon oxide (NO), tantalum pentoxide ($Ta_2O_5$), zirconium oxide ($ZrO_2$), hafnia ($HfO_2$), barium strontium titanate (BST), or other dielectric material with high dielectric constants.

As the dynamic random access memory cell and the dynamic random access memory cell array having vertical channel transistor of the invention have the assisted gates (assisted gate lines) disposed therein, the resistance of the embedded BLs can be controlled by applying a voltage via the assisted gates (assisted gate lines). The resistance of the embedded BLs is consequently lowered to enhance the operation efficiency of the device. Moreover, the height of the embedded BLs can be controlled through the height of the assisted gates (assisted gate lines).

In the dynamic random access memory cell and the dynamic random access memory cell array having vertical channel transistor of the invention, as the assisted gates (assisted gate lines) are disposed between the embedded BLs, the generation of coupling noise between adjacent BLs can be prevented, thereby reducing the device size.

Additionally, the methods for fabricating the dynamic random access memory cell and the dynamic random access memory cell array having vertical channel transistor of the invention are simple.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A dynamic random access memory cell having vertical channel transistor, comprising:
    a semiconductor pillar disposed in a semiconductor substrate and forming an active region of a vertical channel transistor;
    a drain layer disposed at a bottom of the semiconductor pillar;
    an assisted gate disposed beside the drain layer and separated from the drain layer by a first gate dielectric layer, wherein the assisted gate extends along a first direction;
    a control gate disposed beside the semiconductor pillar and separated from the active region by a second gate dielectric layer, wherein the control gate extends along a second direction, and the second direction is different from the first direction;
    a source layer disposed at a top of the semiconductor pillar; and
    a capacitor electrically connected to the source layer.

2. The dynamic random access memory cell having vertical channel transistor as claimed in claim 1, wherein the assisted gate is disposed on two opposite sidewalls of the drain layer.

3. The dynamic random access memory cell having vertical channel transistor as claimed in claim 1, wherein the control gate is disposed on two opposite sidewalls of the semiconductor pillar.

4. The dynamic random access memory cell having vertical channel transistor as claimed in claim 1, wherein the drain layer comprises a doped region.

5. A dynamic random access memory cell array having vertical channel transistor, comprising:
    a plurality of memory cells disposed in a semiconductor substrate and arranged into an array of columns and rows, each of the memory cells comprising:
        a semiconductor pillar forming an active region of a vertical channel transistor;
        a drain layer disposed at a bottom of the semiconductor pillar;
        an assisted gate disposed beside the drain layer and separated from the drain layer by a first gate dielectric layer;
        a control gate disposed beside the semiconductor pillar and separated from the active region by a second gate dielectric layer;
        a source layer disposed at a top of the semiconductor pillar; and
        a capacitor electrically connected to the source layer;
    a plurality of embedded bit lines disposed in parallel under the semiconductor pillars, extending along a column direction, and electrically connected to the drain layers of a same column;
    a plurality of assisted gate lines disposed beside the embedded bit lines and electrically connected to the assisted gates of the same column; and
    a plurality of embedded word lines disposed in parallel above the embedded bit lines, extending along a row direction, and electrically connected to the control gates of a same row.

6. The dynamic random access memory cell array having vertical channel transistor as claimed in claim 5, wherein each of the embedded bit lines is disposed between two adjacent assisted gate lines.

7. The dynamic random access memory cell array having vertical channel transistor as claimed in claim 5, wherein the embedded word lines are disposed on two opposite sidewalls of each of the semiconductor pillars respectively.

8. The dynamic random access memory cell having vertical channel transistor as claimed in claim 5, wherein each of the embedded bit lines comprises a doped region.

9. The dynamic random access memory cell array having vertical channel transistor as claimed in claim 5, wherein the assisted gate lines are electrically connected to one another.

* * * * *